(12) United States Patent
Harvey

(10) Patent No.: US 6,522,140 B2
(45) Date of Patent: Feb. 18, 2003

(54) MR IMAGING METHOD

(75) Inventor: Paul Royston Harvey, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/906,601

(22) Filed: Jul. 17, 2001

(65) Prior Publication Data
US 2002/0011843 A1 Jan. 31, 2002

(30) Foreign Application Priority Data
Jul. 20, 2000 (EP) .............................. 00202606

(51) Int. Cl.[7] ................................. G01V 3/00
(52) U.S. Cl. ................. 324/307; 324/309; 324/318
(58) Field of Search .................... 324/307, 309, 324/312, 314, 318, 322; 600/420

(56) References Cited

U.S. PATENT DOCUMENTS 5,712,567 A * 1/1998 Wang ..................... 324/307
6,150,816 A * 11/2000 Srinivasan .............. 324/318

FOREIGN PATENT DOCUMENTS

WO     WO 00/72036 A1 * 5/1999

OTHER PUBLICATIONS

Klaas P. Pruessmann et al, SENSE: Sensitivity Encoding for Fast MRI; MRM 42 (952–962) 1999.*

* cited by examiner

Primary Examiner—Edward Lefkowitz
Assistant Examiner—Brij B. Shrivastav
(74) Attorney, Agent, or Firm—John Vodopia

(57) ABSTRACT

The invention relates to an MR imaging method which is notably suitable for applications where an as short as possible acquisition time is desired. The method is based on the SENSE method which enables the image acquisition to be performed with a reduced FOV (field of view); parallel, multi-channel detection is then performed by means of receiving elements having different spatial sensitivity profiles. The invention is based on the recognition of the fact that conventional birdcage resonators can be tuned to different resonance modes whose spatial sensitivity profiles deviate strongly. A birdcage resonator that is composed of a plurality of sub-resonators can operate simultaneously in different resonance modes at one resonance frequency and enables parallel, independent signal detection with different sensitivity profiles; according to the invention this feature is used to carry out the SENSE method.

8 Claims, 2 Drawing Sheets

MR IMAGING METHOD

The invention relates to an MR imaging method for determining the distribution of nuclear magnetization in an examination zone, wherein magnetic resonance signals are detected by means of a resonator element under the influence of a sequence of gradient pulses and RF pulses.

It is known that magnetic resonance tomography concerns a spectral imaging method wherein the nuclear magnetization is localized on the basis of the relevant associated resonant frequency while utilizing a spatially inhomogeneous magnetic field (magnetic field gradient). For imaging it is common practice to acquire the magnetic resonance signal as a voltage, induced in a coil surrounding the examination zone, under the influence of a suitable sequence of RF pulses and gradient pulses in the time domain. The actual image reconstruction is performed by Fourier transformation of the time signals. The number, the distance in time, the duration and the strength of the gradient pulses used predetermine the sampling of the reciprocal k space that determines the volume (FOV or field of view) to be imaged as well as the image resolution. A customary pulse sequence, as used for the sequential sampling of the k space, is, for example the EPI (Echo Planar Imaging) sequence. The number of phase encoding steps, and hence the duration of the imaging sequence, is predetermined by the requirements imposed as regards the image size and the image resolution. One of the essential drawbacks of magnetic resonance tomography follows directly therefrom, since the formation of an image of the complete examination zone with a resolution that suffices for diagnostic purposes usually requires an undesirably long period of time.

A large number of technical developments in the field of magnetic resonance tomography aim to achieve a drastic reduction of the image acquisition times. Further developments concerning the equipment, enabling as fast as possible switching of the magnetic field gradients, have nowadays reached the limits of technical feasibility and also the limits of what is reasonable to the patient from a physiological point of view. However, the acquisition times are still too long for a large number of applications, notably also for interventional radiology.

Overcoming the existing technical and physiological speed limits of conventional Fourier imaging seems to have come into sight via the SENSE (sensitivity encoding) technique that has recently become known. This technique is based on the recognition of the fact that the spatial sensitivity profile of the receiving elements (resonators, coils, antennae) impresses on the spin resonance signal position information that can be used for the image reconstruction. Parallel use of a plurality of separate receiving elements, each element having a different respective sensitivity profile, and combination of the respective spin resonance signals detected enables a reduction of the acquisition time required for an image (in comparison with conventional Fourier image reconstruction) by a factor which in the most favorable case equals the number of the receiving members used (see Pruessmann et al., Magn. Reson. Med. 42, pp. 952–962, 1999). It is a drawback of this technique, however, that the signal-to-noise ratio is still approximately proportional to the square root of the image acquisition time. The inherently low sensitivity of magnetic resonance methods, therefore, does not realistically allow the image acquisition times to be reduced by a factor of more than 10, while maintaining an acceptable image quality, by means of the SENSE technique.

Very recently attempts have been made to utilize individual sub-elements of the resonators used for the detection of the spin resonance signals, having a specific different, location-dependent sensitivity profile because of their specific arrangement in space, for the reduction of the acquisition times in conformity with the SENSE technique (see Ledden et al., Proc. Intl. Soc. Mag. Reson. Med. 8, p. 1396, 2000).

So-called birdcage resonators (birdcage coils) are customarily used for volume imaging in magnetic resonance tomography. The first resonance mode of such birdcage resonators is characterized by a $B_1$ field distribution which is homogeneous throughout the inner region of the resonator. The same holds for the spatial sensitivity profile upon detection. The $B_1$ field of the second resonance mode, however, is essentially proportional to the radius, that is, to the distance from the center of the resonator. Eric C. Wong and Wen-Ming Luh have proposed a birdcage resonator which is composed of two sub-resonators which operate in the first and the second resonance mode at the same resonant frequency (see Wong et al., Proceedings of the ISMRM, No. 165, Sidney 1999). Each of the two sub-resonators is connected to a separate detection channel, so that parallel magnetic resonance signals with respective different spatial sensitivity profiles can be detected. The two resonance modes advantageously are orthogonal to one another, so that the two detection channels are completely uncoupled. Wong and Luh combine the two-channel detected magnetic resonance signals upon image reconstruction so as to enhance the sensitivity during the image acquisition, that is, notably at the area of the image periphery. On the basis of the described state of the art it is an object of the present invention to provide an MR imaging method which enables particularly fast image acquisition, can be carried out without great expenditure and necessitates only minor modifications of the conventional magnetic resonance tomography equipment.

This object is achieved by means of an MR imaging method of the kind set forth which is characterized in that the resonator element operates at the same resonance frequency in different resonance modes, the detected magnetic resonance signals being combined upon reconstruction of the magnetic resonance distribution while taking into account the spatial sensitivity profiles of the respective modes so that the resultant image of the examination zone covers a volume that is larger than the scanning zone predetermined by the pulse sequence.

The use of two or more resonance modes with each time different spatial sensitivity profiles allows the described SENSE method to be used for an effective reduction of the image acquisition times in an elegant manner that can be readily carried out. The pulse sequence is shortened in conformity with the number of resonance modes, resulting in a field of vision (FOV) which is significantly smaller than the region of interest. Combination of the magnetic resonance signals detected in the various modes then enables reconstruction of the complete image by means of the SENSE method. The respective spatial sensitivity profiles of the resonance modes must be accurately known for this purpose.

According to a preferred version of the method in accordance with the invention the resonator element is composed of two or more sub-resonators that operate in different resonance modes.

This makes the MR imaging method in accordance with the invention practice-oriented, because its execution necessitates merely the installation of an additional coil in conventional magnetic resonance tomography apparatus or the replacement of the coil present therein by a suitably modified coil.

For the method in accordance with the invention, for example, use can be made of a resonator as proposed by Wong and Luh. The simultaneous operation of such a resonator in the first and the second resonance mode results in two detection channels with strongly deviating spatial sensitivity profiles; this has proven to be very suitable for carrying out the SENSE method. The use of higher resonance modes (third, fourth mode), however, is also readily possible.

It is particularly advantageous when the different resonance modes of the sub-resonators are orthogonal to one another in such a resonator. In that case the individual detection channels are decoupled from one another so that the signal processing and image reconstruction are significantly simplified.

It is advantageous when one of the resonance modes, in the MR imaging method in accordance with the invention which involves an as uniform as possible spatial sensitivity profile is used to apply the RF pulses to the examination zone. This ensures uniform excitation of the nuclear magnetization throughout the examination zone of interest. Should the other sub-resonators not be adequately decoupled, for example, they can then be actively detuned in the transmission mode without great expenditure.

In order to carry out the SENSE method the spatial sensitivity profiles of the resonance modes must be known exactly. For the MR imaging method in accordance with the invention it is advantageously possible to determine the sensitivity profiles by reconstructing reference images from each of the detected magnetic resonance signals by means of a pulse sequence covering the entire examination zone, said reference images being compared with one another. The individual spatial sensitivity profiles are yielded directly by comparison when the spatial sensitivity profile of one of the resonance modes is known. It is then advantageous when, as described above, one of the modes has a uniform spatial sensitivity profile, for example, the first resonance mode.

The method in accordance with the invention can be carried out by means of an MR system which includes a number of gradient coils for generating magnetic field gradients in different spatial directions and a birdcage resonator that is composed of two or more sub-resonators and encloses an examination zone, each sub-resonator being associated with a respective detection channel that communicates with a reconstruction unit. In accordance with the invention the sub-resonators are tuned, at the same resonance frequency, to different resonance modes with each time different spatial sensitivity profiles, the magnetic resonance signals detected in a two-channel or multi-channel fashion during application of a sequence of gradient pulses and RF pulses being combined by means of the reconstruction unit so that, using the sensitivity profiles of the resonance modes that are stored in the reconstruction unit, an image of the examination zone can be reconstructed that covers a volume that is larger than the scanning zone predetermined by the pulse sequence. The reconstruction unit in conventional MR apparatus customarily consists of a computer receiving the digitized magnetic resonance signals for processing. In order to carry out the SENSE method, the spatial sensitivity profiles of the resonance modes must be stored in the computer for the image reconstruction. Algorithms that are suitable for imaging and can be readily implemented in the reconstruction units of conventional MR apparatus are described in literature. Such algorithms enable the image data acquired with a reduced FOV to be reconstructed so as to form a complete image of the examination zone while utilizing the practical knowledge of the spatial sensitivity profiles. Particularly the inherent backfolding (aliasing) effects in the image data acquired with the reduced FOV are thus canceled.

A birdcage resonator which consists of at least two separate, electrically insulated sub-resonators, each consisting of axially extending rods with circular end rings and assembled in a concentric arrangement, is particularly suitable for use in the MR apparatus in accordance with the invention. Such a resonator consists in principle of two conventional birdcage resonators that are slid one into the other and operate, as described above, in different resonance modes at the same resonance frequency. In practice it is not problematic to tune and adapt the two sub-resonators to different resonance modes at the same resonance frequency, for example by a suitable choice of the capacitances. A further advantage consists in the fact that the birdcage resonators used in conventional MR apparatus can be readily replaced or supplemented by a resonator thus constructed.

It is also advantageous when the birdcage resonator is subdivided into shorter sub-resonators in its longitudinal direction. Each of the resonators thus successively arranged in the z direction has a different spatial sensitivity profile; this fact can be used for a corresponding additional reduction of the FOV, accompanied by a resultant speeding up of the image acquisition. The use of sub-resonators with spatial sensitivity profiles that differ both radially and longitudinally enables a reduction of the FOV to be achieved in all three spatial directions.

Embodiments of the invention will be described in detail hereinafter with reference to the Figures. Therein:

Figure 1:
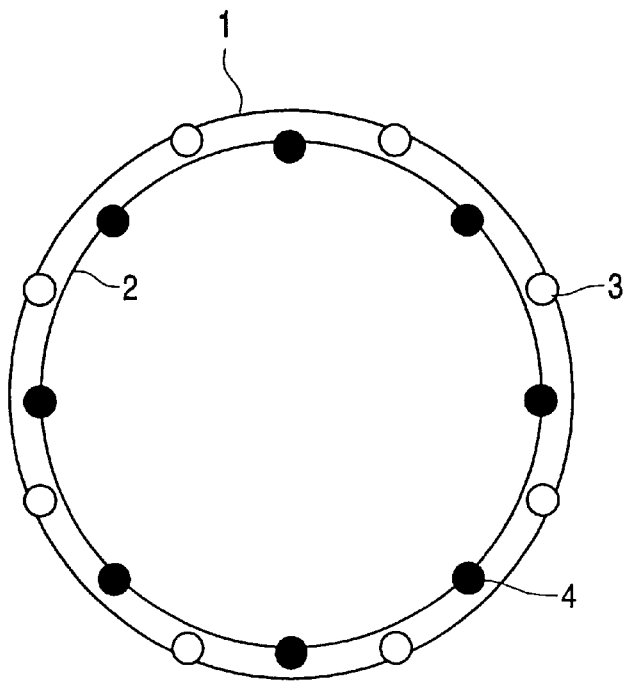
FIG. 1 is a cross-sectional view of a first embodiment of a birdcage resonator composed of two sub-resonators.

FIG. 1 shows a first possibility for realizing a composite birdcage resonator. It consists of two concentric birdcage resonators 1 and 2 which are arranged one within the other so that their rods 3 and 4 are situated at a different distance from the center of the resonator. A suitable choice of the capacitances readily enables tuning of each of the two sub-resonators 1 and 2, being electrically isolated from one another, to different resonance modes at the same resonance frequency.

Figure 2:
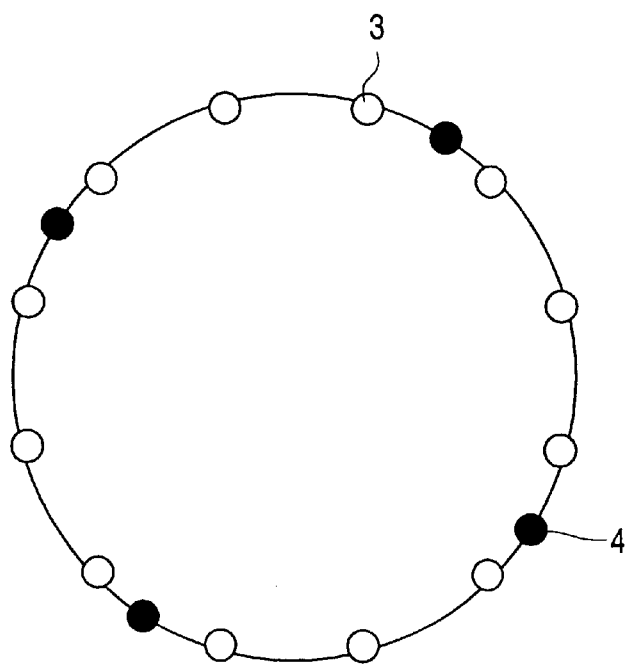
FIG. 2 is a cross-sectional view of a second embodiment of an composite birdcage resonator.

The resonator shown in FIG. 2 comprises, in addition to the rods 3, further rods 4 which are situated at the periphery of the resonator with the same radius. One of the sub-resonators has twelve rods and the other has four rods. The configuration shown enables the resonator that consists of four rods to be tuned to the second resonance mode and the resonator consisting of twelve rods to be tuned to the first resonance mode; the sub-resonator that is tuned to the first resonance mode can operate in quadrature without giving rise to coupling to the resonator that is tuned to the second resonance mode.

Figure 3:
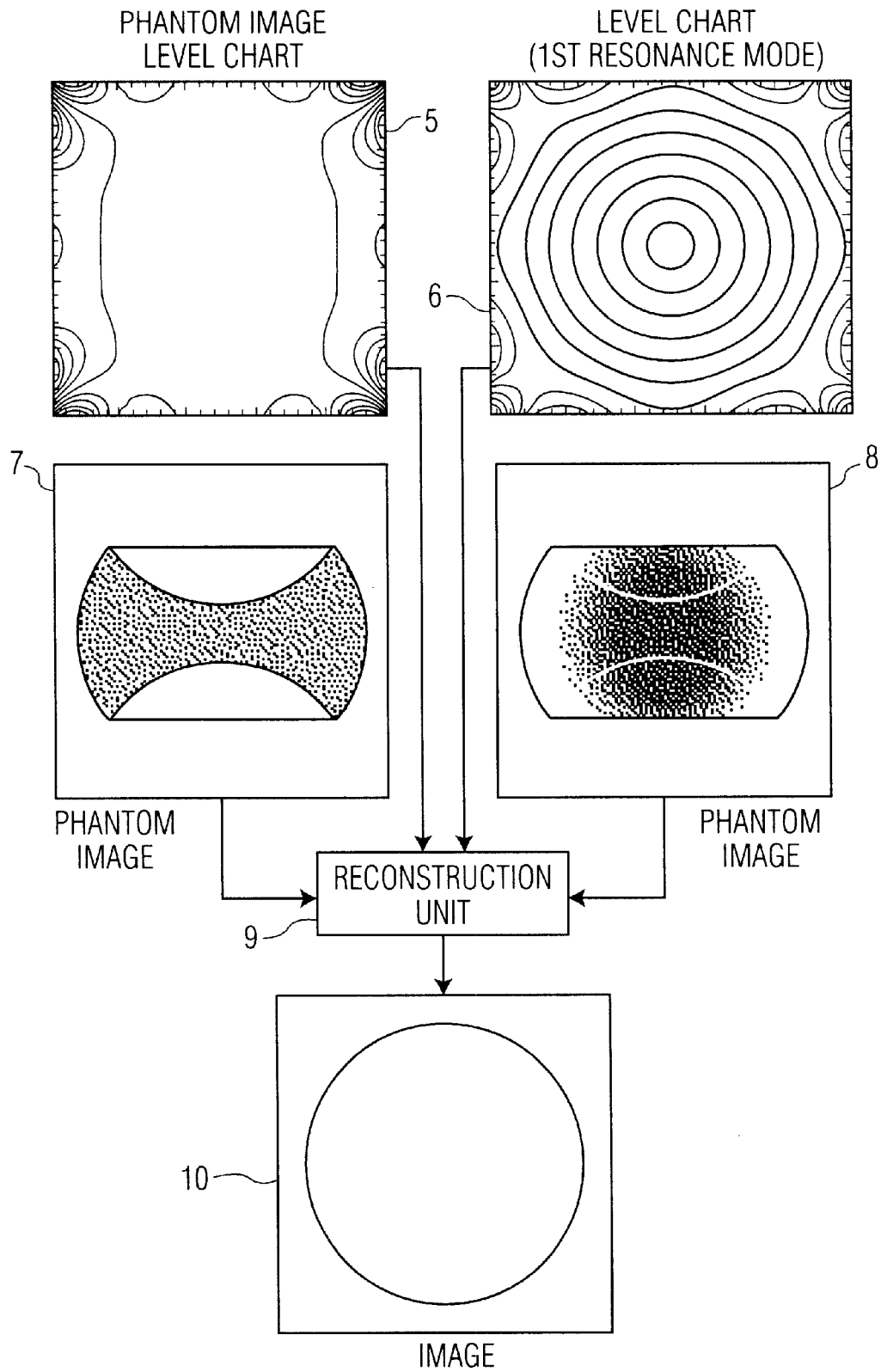
FIG. 3 illustrates the SENSE reconstruction from two sub-images.

FIG. 3 shows the reconstruction of the image of a circular phantom in conformity with the SENSE method. The reference numeral 5 denotes a level chart of the spatial sensitivity profile of a birdcage resonator operating in the first resonance mode, that is, in a cross-sectional view. The sensitivity is always constant on the contours shown. It is clearly shown that in this mode of operation, customarily used in the transmission mode as well as in the receiving mode in magnetic resonance tomography apparatus, the sensitivity inside the resonator is uniform to a high degree. Reference numeral 6 denotes a corresponding level chart for the second resonance mode. The sensitivity has a radial gradient in this mode; at the center of the resonator it equals zero.

The reference numeral 7 denotes a conventionally reconstructed image of the phantom; this image has been acquired with a vertically reduced FOV and the sensitivity profile shown in the chart 5. Different grey values represent different signal intensities. The typical backfolding (aliasing) effects resulting from the reduced FOV are visible at the upper side and the lower side of the image. The image denoted by the reference numeral 8 has been reconstructed in the same way, be it in the second resonance mode of the birdcage resonator as shown in the chart 6. In comparison with the image 7, the image 8 clearly shows rotationally symmetrical attenuations which are due to the characteristic sensitivity profile of the chart 6 relating to the second resonance mode.

Using a suitable SENSE algorithm, implemented in the reconstruction unit 9, the image data 7 and 8 can be combined so as to form an image 10 in which the aliasing effects have been eliminated and the signal intensity is uniform across the entire image area. The formation of the image 10 requires the image data 7 and 8 as well as the associated sensitivity profiles 5 and 6.

What is claimed is:

1. An MR imaging method for determining the distribution of nuclear magnetization in an examination zone, wherein magnetic resonance signals are detected by means of a resonator element under the influence of a sequence of gradient pulses and RF pulses, characterized in that the resonator element operates at the same resonance frequency in different resonance modes, the detected magnetic resonance signals being combined upon reconstruction of the magnetic resonance distribution while taking into account the spatial sensitivity profiles (5, 6) of the respective modes so that the resultant image (10) of the examination zone covers a volume that is larger than the scanning zone (7, 8) predetermined by the pulse sequence.

2. An MR imaging method as claimed in claim 1, characterized in that the resonator element is composed of two or more sub-resonators (1, 2) which operate in different resonance modes.

3. An MR imaging method as claimed in claim 1, characterized in that the different resonance modes are orthogonal to one another.

4. An MR imaging method as claimed in claim 1, characterized in that one of the resonance modes with an as uniform as possible spatial sensitivity profile is used to apply the RF pulses to the examination zone.

5. An MR imaging method as claimed in claim 1, characterized in that the spatial sensitivity profiles of the resonance modes are determined by reconstructing reference images from the detected magnetic resonance signals by means of a pulse sequence covering the entire examination zone, said reference images being compared with one another.

6. An MR apparatus which includes a number of gradient coils for generating magnetic field gradients in different spatial directions and a birdcage resonator that is composed of two or more sub-resonators (1, 2) and encloses an examination zone, each sub-resonator (1, 2) being associated with a respective detection channel that communicates with a reconstruction unit (9), characterized in that the sub-resonators (1, 2) are tuned, at the same resonance frequency, to different resonance modes with each time different spatial sensitivity profiles (5, 6), the magnetic resonance signals detected in a two-channel or multi-channel fashion during application of a sequence of gradient pulses and RF pulses being combined by means of the reconstruction unit (9) so that, using the spatial sensitivity profiles (5, 6) of the resonance modes that are stored in the reconstruction unit (9), an image (10) of the examination zone can be reconstructed that covers a volume that is larger than the scanning zone (7, 8) predetermined by the pulse sequence.

7. An MR apparatus as claimed in claim 6, characterized in that the birdcage resonator is composed of at least two separate sub-resonators (1, 2) which are electrically insulated from one another and each of which consists of axially extending rods (3, 4) with circular end rings in a concentric arrangement.

8. An MR apparatus as claimed in claim 7, characterized in that the birdcage resonator is subdivided into shorter sub-resonators in its longitudinal direction.

* * * * *